United States Patent
Kang et al.

(10) Patent No.: US 9,818,714 B2
(45) Date of Patent: Nov. 14, 2017

(54) METHOD OF MANUFACTURING SUBSTRATE FOR CHIP PACKAGES AND METHOD OF MANUFACTURING CHIP PACKAGE

(75) Inventors: Tea Hyuk Kang, Seoul (KR); Hong Il Kim, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 599 days.

(21) Appl. No.: 14/342,497

(22) PCT Filed: Aug. 31, 2012

(86) PCT No.: PCT/KR2012/006999
§ 371 (c)(1),
(2), (4) Date: May 13, 2014

(87) PCT Pub. No.: WO2013/032277
PCT Pub. Date: Mar. 7, 2013

(65) Prior Publication Data
US 2014/0268619 A1 Sep. 18, 2014

(30) Foreign Application Priority Data

Sep. 2, 2011 (KR) .................. 10-2011-0089073
Nov. 29, 2011 (KR) .................. 10-2011-0125690
(Continued)

(51) Int. Cl.
*H05K 3/20* (2006.01)
*H01L 23/00* (2006.01)
(Continued)

(52) U.S. Cl.
CPC ............ *H01L 24/27* (2013.01); *H01L 21/486* (2013.01); *H01L 21/70* (2013.01); *H01L 23/12* (2013.01);
(Continued)

(58) Field of Classification Search
CPC .......... H01L 24/27; H01L 23/48; H01L 23/12; H05K 3/10; H05K 3/067; H05K 13/046;
(Continued)

(56) References Cited

U.S. PATENT DOCUMENTS 5,773,561 A 6/1998 Sachdev et al.
8,367,473 B2 * 2/2013 Huang .................. H01L 24/32
257/690

(Continued)

FOREIGN PATENT DOCUMENTS

JP H05152362 A 6/1993
JP 09-055444 A 2/1997
(Continued)

OTHER PUBLICATIONS

Office Action dated Oct. 20, 2014 for Taiwanese Application No. 101131760.
(Continued)

*Primary Examiner* — Peter DungBa Vo
*Assistant Examiner* — Azm Parvez
(74) *Attorney, Agent, or Firm* — Saliwanchik, Lloyd & Eisenschenk (57) ABSTRACT

Provided are a method of manufacturing a substrate for chip packages and a method of manufacturing a chip package, the method of manufacturing the substrate including: forming a lower adhesive layer in a lower part of an insulation film; forming an upper adhesive layer in an upper part of the insulation film to form a base material; forming via holes in the base material; and forming a circuit pattern layer on the upper adhesive layer, so it is effective to improve adhesion power between the molding resin and the insulation film at the time of manufacturing a chip package later.

11 Claims, 7 Drawing Sheets

(30) Foreign Application Priority Data

Dec. 26, 2011 (KR) .................. 10-2011-0142517
Mar. 20, 2012 (KR) .................. 10-2012-0028322

(51) Int. Cl.
| | |
|---|---|
| H01L 23/498 | (2006.01) |
| H01L 21/48 | (2006.01) |
| H01L 21/70 | (2006.01) |
| H01L 23/12 | (2006.01) |
| H01L 23/48 | (2006.01) |
| H05K 1/11 | (2006.01) |
| H05K 3/06 | (2006.01) |
| H05K 3/10 | (2006.01) |
| H05K 13/04 | (2006.01) |
| H01L 23/31 | (2006.01) |

(52) U.S. Cl.
CPC .......... *H01L 23/3142* (2013.01); *H01L 23/48* (2013.01); *H01L 23/49827* (2013.01); *H01L 24/48* (2013.01); *H05K 1/115* (2013.01); *H05K 3/067* (2013.01); *H05K 3/10* (2013.01); *H05K 13/046* (2013.01); *H01L 23/3121* (2013.01); *H01L 2224/48091* (2013.01); *H01L 2224/48227* (2013.01); *H01L 2224/48228* (2013.01); *H01L 2924/00014* (2013.01); *H01L 2924/10253* (2013.01); *H01L 2924/12041* (2013.01); *H01L 2924/12042* (2013.01); *H01L 2924/181* (2013.01); *H01L 2924/1815* (2013.01); *H01L 2924/18301* (2013.01); *Y10T 156/1056* (2015.01)

(58) Field of Classification Search
CPC .............. H05K 1/115; Y10T 29/49128; Y10T 29/49124; Y10T 29/49117; Y10T 29/49002; Y10T 29/4913
USPC ............... 29/831, 829, 592.1, 832; 361/783; 156/247, 252; 174/262; 427/535, 556, 427/97.3
See application file for complete search history.

(56) References Cited

U.S. PATENT DOCUMENTS

| | | | |
|---|---|---|---|
| 2004/0234741 A1 | 11/2004 | Hosomi et al. | |
| 2006/0131067 A1 | 6/2006 | Byun et al. | |
| 2009/0101928 A1* | 4/2009 | Kim | H01L 51/5206 257/98 |
| 2010/0288541 A1* | 11/2010 | Appelt | H01L 21/486 174/257 |
| 2012/0125667 A1* | 5/2012 | Jung | H05K 3/4644 174/251 |

FOREIGN PATENT DOCUMENTS

| | | | | |
|---|---|---|---|---|
| JP | 09055444 A | * | 2/1997 | ............ H01L 24/97 |
| JP | 10-189808 A | | 7/1998 | |
| JP | 2000-096031 A | | 4/2000 | |
| JP | 2010-171403 A | | 8/2010 | |
| KR | 10-1998-0041884 A | | 8/1998 | |
| KR | 10-0608610 B1 | | 8/2006 | |
| KR | 20100102893 A | | 9/2010 | |
| TW | 398164 B | | 7/2000 | |
| TW | 517502 B | | 1/2003 | |

OTHER PUBLICATIONS

Hegemann, D. et al. "Plasma treatment of polymers for surface and adhesion improvement" *Nuclear Insturments and Methods in Physics Research.* B 208 (2003) 281-286. Germany.

International Search Report in International Application No. PCT/KR2012/006999, filed Aug. 31, 2012.

Office Action dated Feb. 6, 2017 in Korean Application No. 1020110089073.

Office Action dated Jul. 31, 2017 in Korean Application No. 10-2011-0142517.

Office Action dated Jul. 20, 2017 in Korean Application No. 10-2011-0125690.

* cited by examiner

METHOD OF MANUFACTURING SUBSTRATE FOR CHIP PACKAGES AND METHOD OF MANUFACTURING CHIP PACKAGE

CROSS-REFERENCE TO RELATED APPLICATIONS

This application is the U.S. national stage application of International Patent Application No. PCT/KR2012/006999, filed Aug. 31, 2012, which claims priority to Korean Application Nos. 10-2011-0089073, filed Sep. 2, 2011; 10-2011-0125690, filed Nov. 29, 2011; 10-2011-0142517, filed Dec. 26, 2011 and 10-2012-0028322, filed Mar. 20, 2012, the disclosures of each of which are incorporated herein by reference in their entirety.

TECHNICAL FIELD

Embodiments of the present invention relate to the technical field of a chip package, more specifically, a technology of manufacturing a substrate for chip packages.

BACKGROUND ART

The technologies relating to a semiconductor or an optical device have been steadily developed to meet the requirements for high densification, miniaturization, and high performance. However, because the technologies have relatively fallen behind technologies for manufacturing a semiconductor, attempts have been recently made to settle the requirements for high performance, miniaturization and high densification by the development of technologies relating to packages.

In connection with semiconductor/optical device packages, a silicon chip or an LED (light emitting diode) chip, a smart IC chip and the like are bonded onto a substrate using a wire bonding method or an LOC (lead on chip) bonding method.

Figure 1:
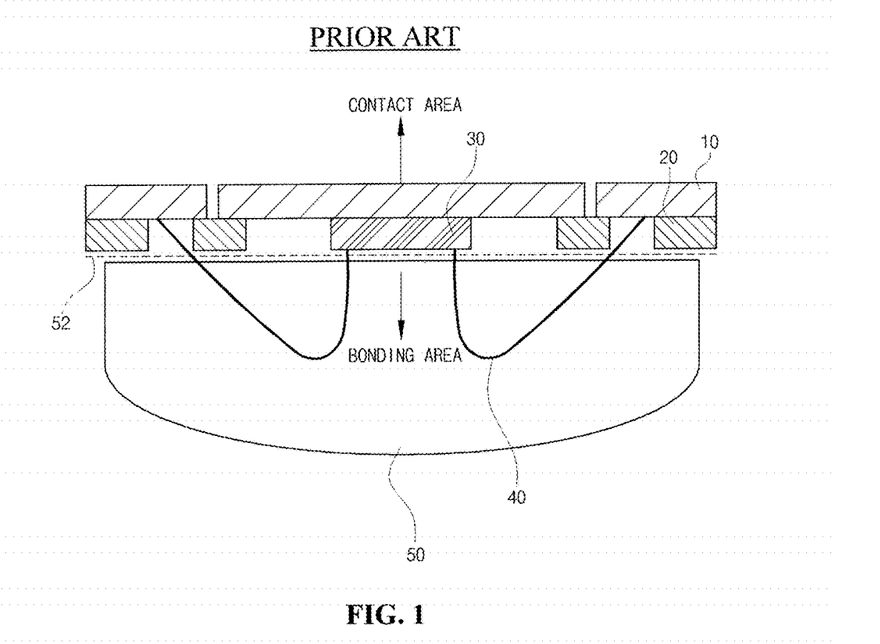
FIG. 1 is a cross-section view showing a conventional smart IC chip package.

FIG. 1 is a view showing a cross-section view of a general smart IC chip package.

Referring to FIG. 1, the general smart IC chip package includes: an insulation layer 20 in which via holes are formed; a circuit pattern layer 10 formed on one surface of the insulation layer 20; and an IC chip 30 mounted on the circuit pattern layer 10.

The IC chip 30 is electrically connected to the circuit pattern layer 10 by a wire 40. The IC chip 30 and the wire 40 are molded by a molding part 50 formed of epoxy resin, and the like, and the molding part 50 is formed on the insulation layer 20 as illustrated in FIG. 1.

In this case, it is problematic that since surface the insulation layer 20 lacks its surface energy, the adhesion power of a boundary surface 52 which comes into contact with the molding part 50 is deteriorated. Thus, it is problematic that a separation phenomenon occurs such that the molding part 50 and the insulation layer 20 are separated from each other, so the reliability and durability of a product are deteriorated.

In particular, in a case where the insulation layer 20 is formed of a film material, for example, polyimide, due to the polyimide itself own characteristics which show very low surface energy and poor surface adhesion power, the problem such as occurrence of the separation phenomenon further came to the fore.

DISCLOSURE OF INVENTION

Technical Problem

Embodiments of the present invention have been made keeping in mind the above problems, and an aspect of the present invention is to prevent a molding part and a substrate for chip packages from being separated from each other and to improve the reliability and durability of a product by forming a lower adhesive layer in advance in a lower part of an insulation film at the time of manufacturing a substrate for chip package using the insulation film to increase surface energy.

Solution to Problem

According to an aspect of embodiments of the present invention, there is provided a method of manufacturing a substrate for chip packages, comprising: forming a lower adhesive layer in a lower part of an insulation film; forming an upper adhesive layer in an upper part of the insulation film to produce a base material; forming via holes in the base material; and forming the circuit pattern layer on the upper adhesive layer.

In the method of manufacturing the substrate for chip packages, the forming of the lower adhesive layer may be performed by including laminating a prepreg on the lower part of the insulation film.

The method of manufacturing the substrate for chip packages may further include forming surface roughness on the prepreg after the laminating of the prepreg.

In the method of manufacturing the substrate for chip packages, the forming of the surface roughness may be performed by including laminating a copper foil layer having the surface roughness formed on a lower part of the prepreg to transfer the surface roughness to the prepreg, and etching the copper foil layer.

In the method of manufacturing the substrate for chip packages, an Rz value of the surface roughness may have formed in a range of 3 to 10 μm.

In the method of manufacturing the substrate for chip packages, the insulation film may be formed of polyimide, Polyethylene naphthalate, or polyethyleneterephthalate.

In the method of manufacturing the substrate for chip packages, the adhesive layer may be composed of an adhesive or a bonding sheet.

In the method of manufacturing the substrate for chip packages, the forming of the via holes may be performed by a punching process or a laser drill process, but which is not limited to this.

In the method of manufacturing the substrate for chip packages, the forming of the circuit pattern layer may be performed by including forming a metal layer on the adhesive layer, and etching the metal layer to form a circuit pattern. At this time, the metal layer may be formed of Cu, but which is not limited to this.

The method of manufacturing the substrate for chip packages may further include forming a plated layer selectively on one surface of the circuit pattern layer or both surfaces after the forming of the circuit pattern layer. At this time, the plated layer may include at least one of Ni, and Au.

The method of manufacturing the substrate for chip packages to solve the aforesaid problems may include: mounting a chip in a lower part of the lower adhesive layer of the substrate for chip packages manufactured by the aforesaid method bonding the chip and the circuit pattern layer using a wire to electrically connect them, and forming a molding part which embeds the chip and the wire in a lower part of the chip.

Advantageous Effects of Invention

In accordance with the embodiments of the present invention, the lower adhesive layer may be formed in the insulation film in advance during the manufacturing process of the substrate for the chip package, thereby being capable of securing process efficiency and stability.

Furthermore, in accordance with the embodiments of the present invention, it is advantageous that when manufacturing the chip package, adhesion power between the insulation film and the molding resin can be increased, thereby improving reliability and durability of the chip package.

Moreover, In accordance with the embodiments of the present invention, as the chip package is manufactured using the insulation film, the effects such as the light weight, small size, and simplified thin thickness of a product can be additionally achieved.

BRIEF DESCRIPTION OF DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

MODE FOR THE INVENTION

Exemplary embodiments according to the present invention will now be described more fully hereinafter with reference to the accompanying drawings. The exemplary embodiments of the present invention may, however, be embodied in many different forms and should not be construed as limited to the embodiments set forth herein. Rather these example embodiments are provided so that this disclosure will be thorough and complete, and will fully convey the scope of the invention to those skilled in the art. Furthermore, when it is determined that specific descriptions regarding publicly known relevant functions or configurations may unnecessarily be beside main points of the present invention, corresponding descriptions are omitted. It will be further understood that terms used herein should be interpreted as having a meaning that is consistent with their meaning in the context of this specification. With regard to the elements which perform similar functions and operations, like numbers refer to like elements through the specification.

Figure 2:
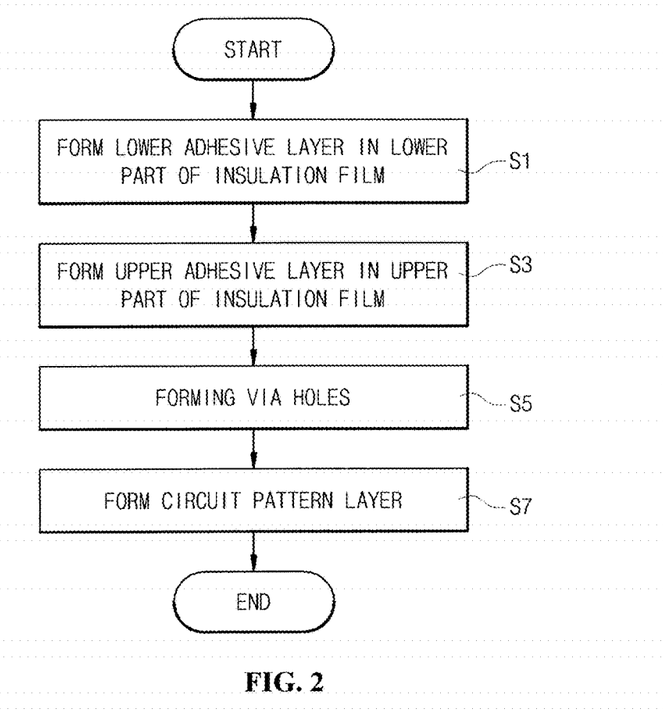
FIG. 2 is a flow chart of a method of manufacturing a substrate for chip packages according to an exemplary embodiment of the present invention.

FIG. 2 is a flow chart of a method of manufacturing a substrate for chip packages according to an exemplary embodiment of the present invention.

Referring to FIG. 2, the method of manufacturing the substrate for chip packages according to the present embodiment of the invention may include forming a lower adhesive layer in a lower part of an insulation film (S1); forming an upper adhesive layer in an upper part of the insulation film to produce a base material (S3); forming via holes in the base material (S5); and forming a circuit pattern layer in a lower part of the base material (S7). Furthermore, even though this is not illustrated in the drawings, after step S7, the method of manufacturing the substrate for chip packages may further include forming a plated layer electively on one surface of the circuit pattern layer or both surfaces.

Specifically, step S1 may be performed as follows.

First, the insulation film is prepared. At this time, a material of the insulation film may be formed of a film material made of polyimide, polyethylene naphthalate, (hereinafter referred to as '"PEN") or polyethyleneterephthalate (hereinafter referred to as 'PET'), but the material is not limited to this.

Then, the lower adhesive layer is formed on a lower surface of the insulation film. At this time, the forming of the lower adhesive layer is performed by laminating a prepregon a lower part of the insulation film, but which is not limited to this. Thus, as the lower adhesive layer is formed in advance during the manufacturing process of the substrate for chip packages, it would not be necessary to form a separate adhesive layer later, thereby being capable of improving efficiency of the manufacturing process, and as the prepreg which relatively is low in price is used, a production cost can be reduced. Furthermore, the lower adhesive layer formed during the manufacturing process performs the function of a supporting layer, thereby being capable of securing process stability. Additionally, in spite of low surface energy of the insulation film, adhesion power between the insulation film and the molding part formed at the time of manufacturing the chip package can be improved.

After forming the lower adhesive layer, the adhesive layer is formed on an upper part of the insulation film to produce the base material (S3). The adhesive layer is a part that performs the function of a medium for connecting the insulation film and the circuit pattern layer which will be formed later. The forming of the adhesive layer may be formed by a method of performing a laminating process after applying an adhesive on an upper part of the insulation film or a method of performing the laminating process after attaching the bonding sheet to the lower part of the insulation layer.

At this time, the adhesive layer may be formed of a material including any one of epoxy resin, acrylic resin, and polyimide resin, and more specifically, may be formed of epoxy resin or polyimide resin. Furthermore, with intent to have flexibility, various natural rubbers, a plasticizer, a hardener, phosphorous flame retardant, and other various additives may be added to the material of forming the adhesive layer. Moreover, the polyimide resin may mainly use thermal polyimide, but thermal curable resin may be also used. However, this is only one example. The adhesive layer may be formed of all resins having adhesive properties which have been developed and commercialized or can be implemented according to future technical development.

Then, at least one via hole is formed in the base material obtained in step S3 (S5). The via hole may include a via hole on which a chip is mounted, a via hole for electrically connecting each layer, a thermal via hole for easily diffusing heat, and a via hole which becomes a basis for aligning each layer. At this time, as for a method of forming the via hole, a punching processing method, a drill process using a laser and the like may be used. In addition to this, all method of forming via holes which has been developed and commercialized or can be implemented according to future technical development may be used.

Meanwhile, even though it is not illustrated, a process of forming surface roughness on a surface of the lower adhesive layer may be further performed between step S1 and step S5. The process may be performed as follows.

First, an electrolytic copper foil is laminated in a lower part of the lower adhesive layer. At this time, surface roughness formed on a surface of the electrolytic copper foil is transferred to the lower adhesive layer, and consequently, surface roughness is formed on the lower adhesive layer. At this time, an Rz value of the surface roughness formed in the lower adhesive layer may be adjusted by adjusting conditions such as a thickness of the electrolytic copper foil, laminating conditions (for example, temperature or pressure) and the like. More specifically, the Rz value may be formed in a range of 3 to 10 μm, but which is not limited to this. In a case where the surface roughness (Rz) is less than 3 μm, it would be difficult to have the effect of the improvement of adhesion power with the molding part when manufacturing a completed product later. Furthermore, when the surface roughness has an Rz value of more than 10 μm, grains which forms the surface roughness are separated in a powder shape, thereby causing pollution during a manufacturing process relating to a chip package.

Then, when the aforesaid electrolytic copper foil is removed by an etching process, surface roughness may be formed on the lower adhesive layer. Thus, in a case where a molding resin is applied to the lower part of the lower adhesive layer later, thank to the surface roughness, adhesion power between the substrate for the chip package and the molding resin can be improved, and reliability and durability of the chip package can be improved.

In step S5, after the via holes are formed in the base material, the circuit pattern layer is formed in the lower part of the base material (S7). At this time, the forming of the circuit pattern layer may be realized as follows. First, the metal layer is formed in the lower part of the base material. At this time, the metal layer may be formed of Cu, but which is not limited to this. Then, the circuit pattern layer is formed by etching the metal layer. More specifically, the surface of the metal layer is activated through various chemical treatments, and thereafter photo resist is coated, and exposure and developing processes are performed. After the developing process is completed, a necessary circuit is formed by the etching process, so that the circuit pattern layer may be formed by peeling off the photo resist.

Meanwhile, even though it is not limited in the drawings, after step S7, a plating process which forms the plated layer on one surface of the circuit pattern layer or both surfaces may be further performed. At this time, the plating process may be an electrolytic plating process, and a plated material may use at least one of Ni and Au.

The substrate for chip packages manufactured by the aforesaid method is effective to improve adhesive power between the substrate for chip packages and the molding resin, and to improve reliability and durability of the chip package (e.g., a COB type) in spite of the use of the insulating film. Moreover, additional effects such as the light weight and small size, and simplified thin thickness of a product may be achieved.

Figure 3:
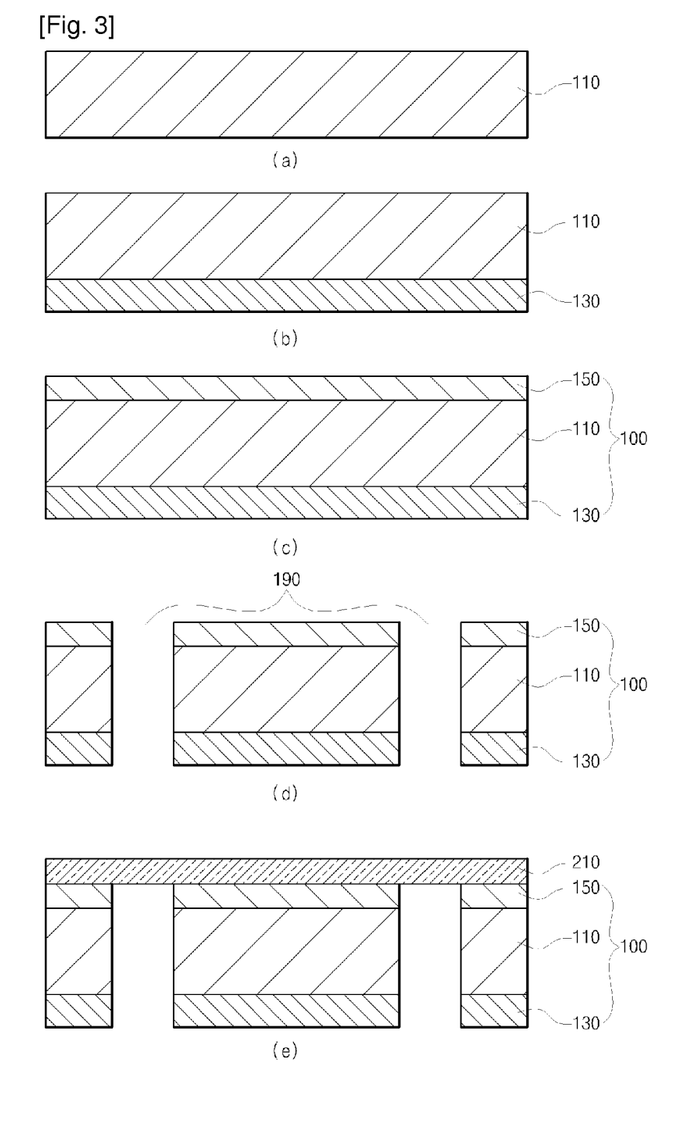
FIG. 3 and FIG. 4 are process exemplification views roughly illustrating processes for manufacturing methods of a substrate for chip packages, and a chip package according to another exemplary embodiment of the present invention.
Figure 4:
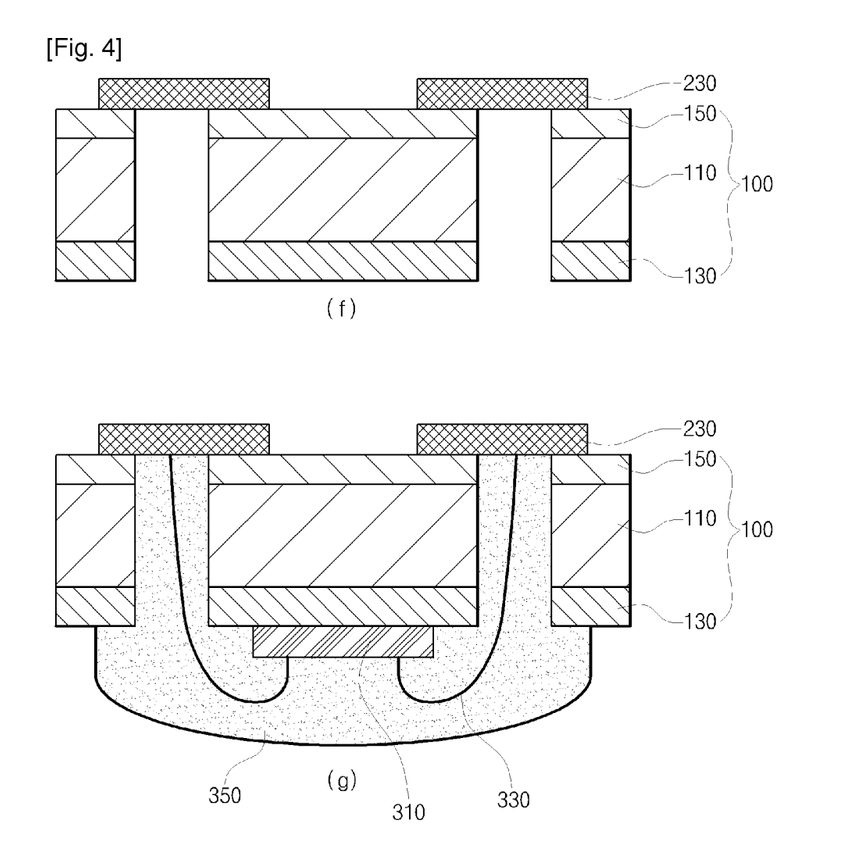

FIG. 3 and FIG. 4 are process exemplification views roughly illustrating processes for manufacturing methods of a substrate for chip packages and a chip package according to another exemplary embodiment of the present invention.

Referring to FIG. 2 to FIG. 4, as illustrated in FIG. 3(a), an insulation film 110 is first prepared. At this time, the insulation film 110 may use a film material made of polyimide, PEN or PET, but the material is not limited to this as previously described in the explanation of FIG. 2. Then, as illustrated in FIG. 3(b), a lower adhesive layer 130 is formed in a lower part of the insulation film 110. At this time, the forming of the lower adhesive layer 130 may be performed by a method of laminating prepreg. In addition, as illustrated in FIG. 3(C), an insulation layer 150 is formed in an upper part of the insulation film 110 to produce a base material 100. The forming of the adhesive layer 150 may be realized by a method of performing a laminating process after applying an adhesive, or a method of performing a laminating process after attaching a bonding sheet to.

Then, as illustrated in FIG. 3(d), via holes 190 are formed on the base material 100. At this time, as for methods of forming the via holes, a punching processing process or a laser drill process and the like may be used. As previously described in the explanation of FIG. 2, the via holes 190 may performed the functions of via holes such as a via hole on which an optical device, namely, a chip, is mounted, a via hole for electrically connecting each layer, a thermal via hole for easily diffusing heat, and a via hole which becomes a basis for aligning each layer.

After forming the via holes 190, as illustrated in FIG. 3(e), a metal layer 210 is formed in an upper part of the base material 100, more specifically, an upper part of the adhesive layer 150. At this time, a method of forming the metal layer 210 may be realized by the laminating process. A material which forms the metal layer 210 may use Cu, but the material is not limited to this, as previously described in the explanation of FIG. 2.

Then, after the surface of the metal layer 210 is activated through various chemical treatments, a photo resist is the applied thereto, and exposure and developing processes are performed. Furthermore, after the development process is completed, a necessary circuit pattern is formed by an etching process, and a circuit pattern layer 230 as illustrated in FIG. 4(f) is formed by peeling off the photo resist to thereby produce the substrate for chip packages.

Meanwhile, a plated layer, which is not illustrated in the drawings, may be formed by further performing a process for plating the circuit pattern layer. As for this plating process, an electrolytic plating process may be used. More specifically, based on the drawing as illustrated in FIG. 3(f), the plated layer may be formed by plating the upper part of the circuit pattern layer 230 with Au, and may be also formed by plating the lower part of the circuit pattern layer 230 exposed by the via holes with Ni.

After the substrate for chip packages is manufactured by the aforesaid processes, a chip 310 is mounted on a lower part of the lower adhesive layer 130, the chip 310 and the circuit pattern layer 130 are bonded and are electrically connected to each other using a wire 330, and a molding resin is applied to a lower part of the chip 310 to thereby form a molding part 350 which embeds the chip and the wire 330 so that a chip package may be manufactured.

Figure 5:
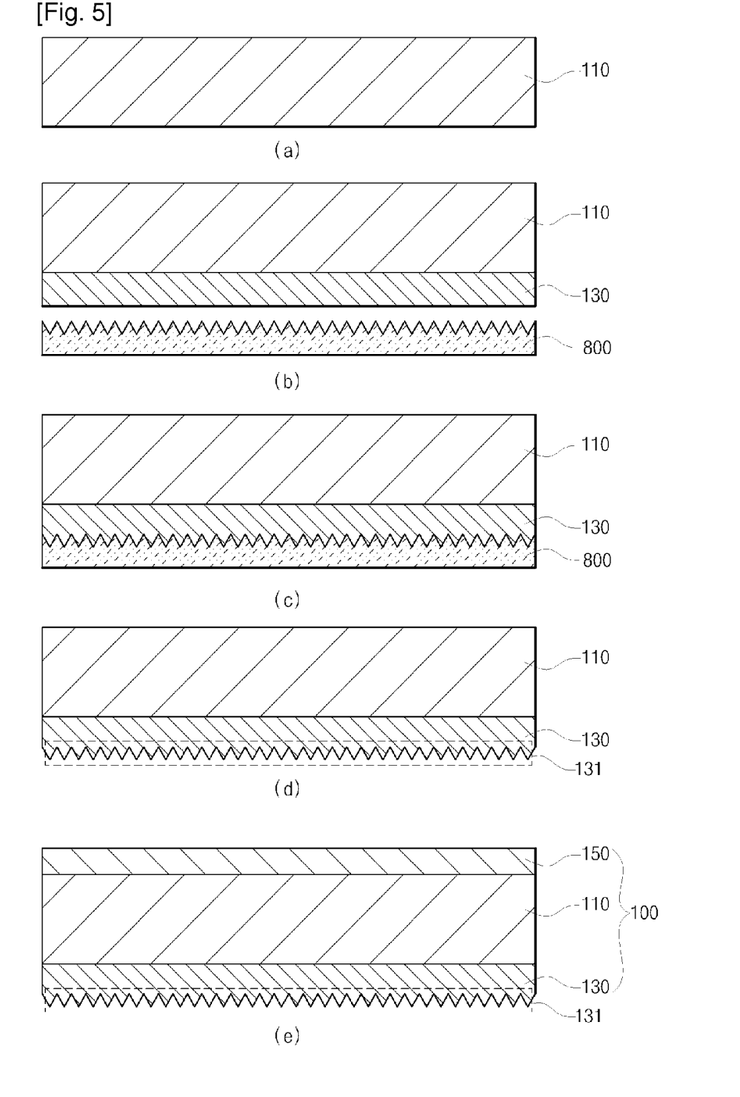
FIG. 5 and FIG. 6 are process exemplification views roughly illustrating processes for manufacturing methods of a substrate for chip packages, and a chip package according to a further exemplary embodiment of the present invention.
Figure 6:
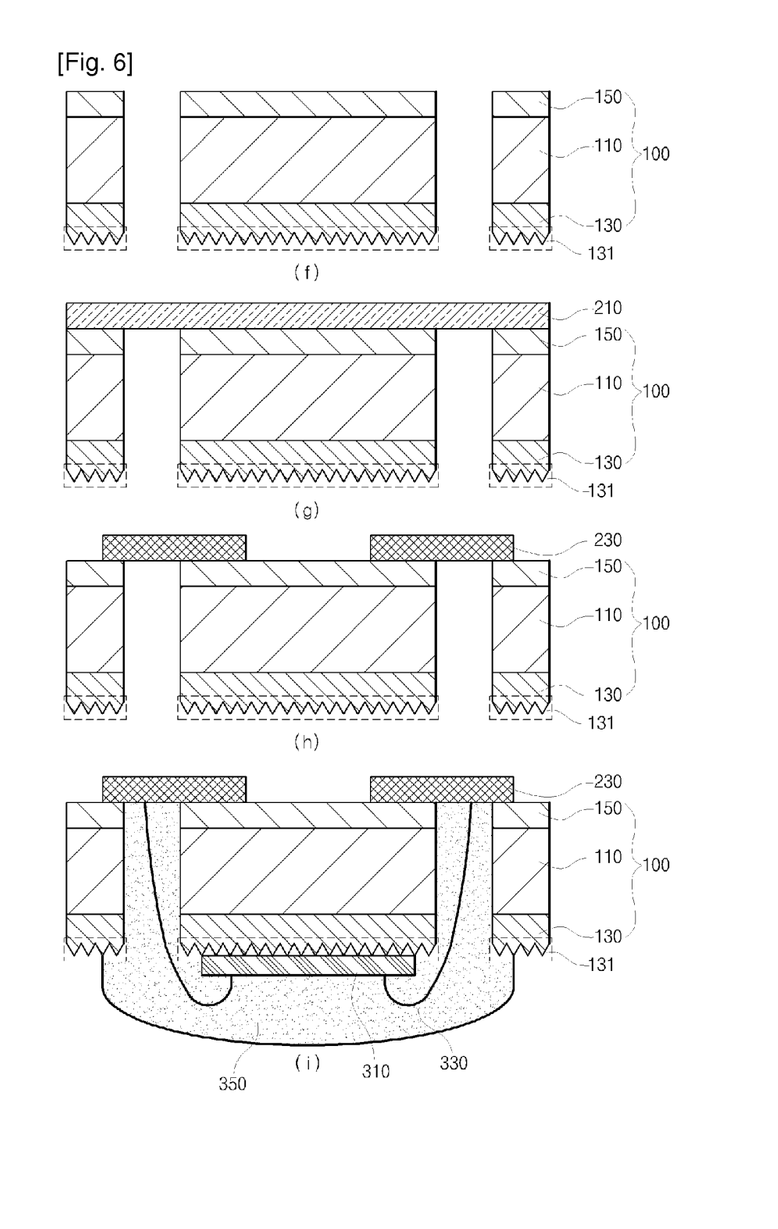

FIG. 5 and FIG. 6 are process exemplification views roughly illustrating processes for manufacturing methods of a substrate for chip packages and a chip package according to a further exemplary embodiment of the present invention.

Referring to FIG. 2 to FIG. 6, as illustrated in FIG. 5(a), the insulation film 110 is prepared, and as illustrated in FIG. 5(b), the lower adhesive layer 130 is formed in a lower part of the insulation film 110.

In addition, as illustrated in FIGS. 5(b) and (c), an electrolytic copper foil 800 is laminated in the lower part of the lower adhesive layer 130. At this time, surface roughness formed on a surface of the electrolytic copper foil 800 is transferred to the lower adhesive layer 130. As previously described in the explanation of FIG. 2, an Rz value of the surface roughness formed in the lower adhesive layer130 may be adjusted by adjusting conditions such as a thickness of the electrolytic copper foil, laminating conditions (e.g., temperature or pressure).

Then, when the electrolytic copper foil is removed by the etching process, as illustrated in FIG. 5(d), constructions on which surface roughness 120 is formed may be obtained in the lower adhesive layer 130. At this time, the Rz value of the surface roughness 131 may be formed within a range of 3 to 10 μm to improve adhesive power with the molding resin and to prevent pollution during manufacturing processes, but which is not limited to this, as previously described in the explanation of FIG. 2.

After the surface roughness is formed, as illustrated in FIG. 5(d), the adhesive layer 150 is formed in the upper part of the insulation film 110 to thereby produce the base material 100. The forming of the adhesive layer 150 may be realized by the methods of performing the laminating process after coating the adhesive material or after attaching the bonding sheet, as previously described in the explanations of FIG. 2 to FIG. 3.

Then, as illustrated in FIG. 5(e), the via holes 190 may be formed in the base material 100, and at this time, the method of forming the via holes 190 may use the punching processing process or the laser drill process and the like.

After the via holes are formed, as illustrated in FIG. 6(f), the metal layer 210 is formed in the upper part of the base material 100, more specifically, the upper part of the adhesive layer 150. At this time, the method of forming the metal layer 210 may be realized by the laminating process. The material which forms the metal layer 210 may use Cu, but which is not limited to this, as previously described in the explanation of FIG. 2.

Then, the circuit pattern layer 230 as illustrated in FIG. 6(g) is formed by patterning the metal layer 210 to thereby manufacture the substrate for chip packages.

Meanwhile, even if it is not illustrated in the drawings, the plated layer may be further formed by further performing the process for plating the circuit pattern layer. The plating process may use the electrolytic plating process, as previously described in the explanations of FIG. 2 and FIG. 4.

After the substrate for the chip packages is manufactured by the aforesaid processes, the chip is mounted on the lower part of the lower adhesive layer 130, the chip 310 and the circuit pattern layer 230 are bonded and are electrically connected to each other using the wire 330, and the molding part 350 which embeds the chip 310 and the wire 330 is formed by coating the molding resin with the lower part of the chip 310, so that the chip package may be manufactured.

In accordance with the present exemplary embodiment, surface energy of the substrate for chip packages may be increased by further forming surface roughness on the lower adhesive layer, so adhesion power between the chip and the substrate for chip packages, and between the chip and the molding part can be more improved, thereby being capable of manufacturing the chip package having improved reliability and durability.

Figure 7:
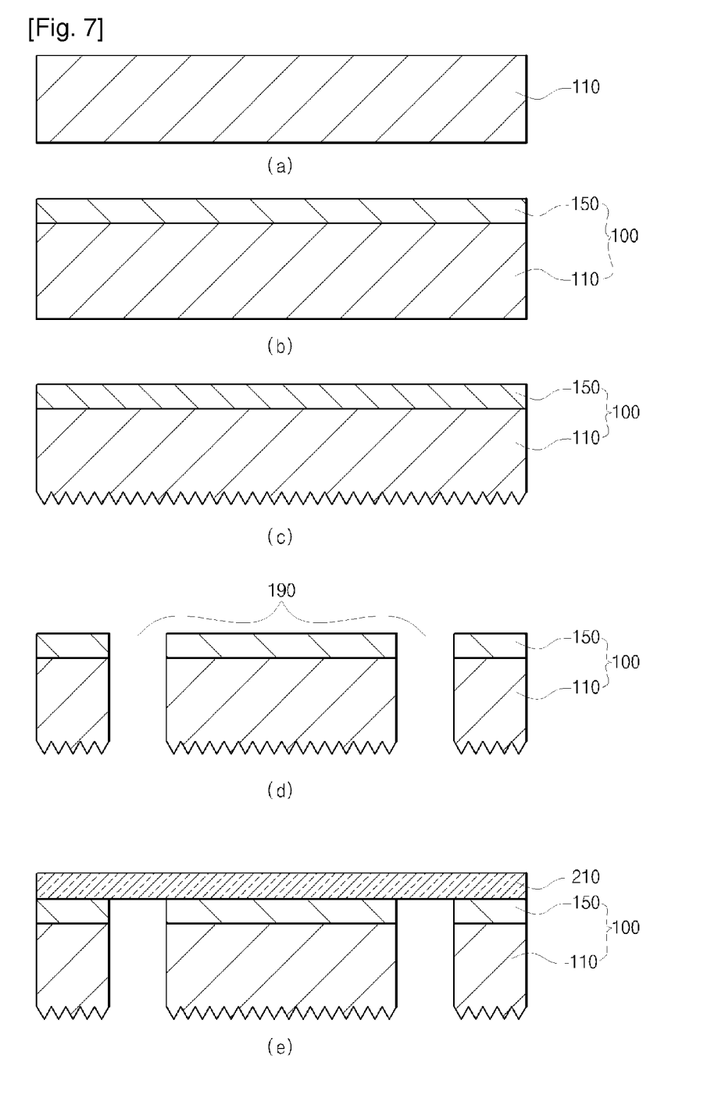
FIG. 7 and FIG. 8 are process exemplification views roughly illustrating processes for manufacturing methods of a substrate for the chip packages, and a chip package according to yet another exemplary embodiment of the present invention.
Figure 8:
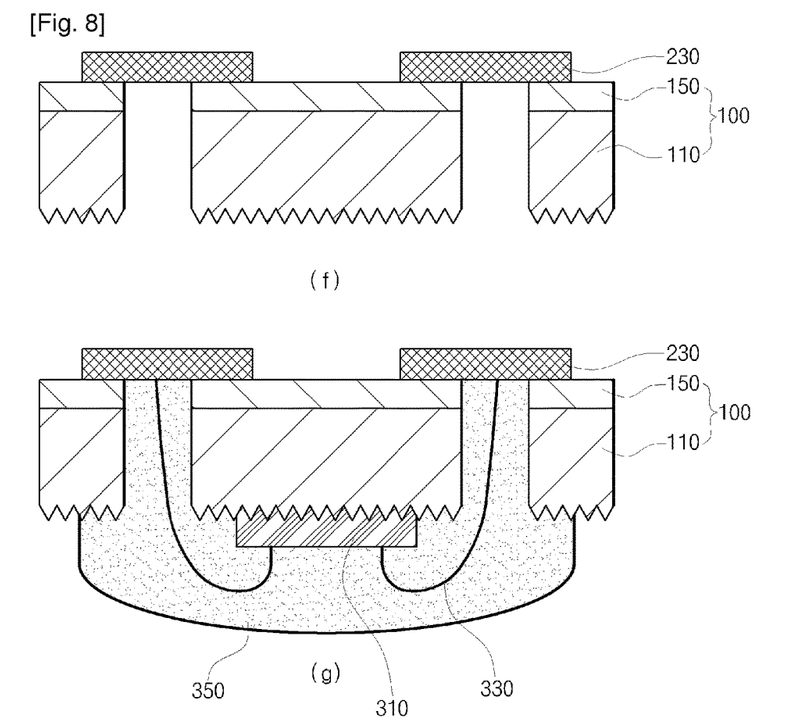

FIG. 7 and FIG. 8 are process exemplification views roughly illustrating processes for manufacturing methods of a substrate for the chip packages, and a chip package according to yet another exemplary embodiment of the present invention.

Referring to FIG. 7 to FIG. 8, as illustrated in FIG. 7(a), the insulation film 110 is first prepared. At this time, as for the insulation film 110, a film material made of polyimide, PEN or PET may be used, but which is not limited to this, as previously described in the explanation of FIG. 2. Then, as illustrated in FIG. 7(b), the adhesive layer 150 is formed in the upper part of the insulation film 110 to thereby manufacture the base material 100. The forming of the adhesive layer 150 may be realized by the method of performing the laminating process after coating the adhesive or after attaching the bonding sheet.

Subsequently, as illustrated in FIG. 7(c), plasma treatment is performed on one surface of the insulation film 110, namely, a surface on which the chip 310 is mounted to thereby increase roughness of the one surface of the insulation film 110. That is, plasma treatment is performed on a surface coated with the molding resin of the insulation film 110 by using Ar gas among publicly known plasma gases.

Figure 9:
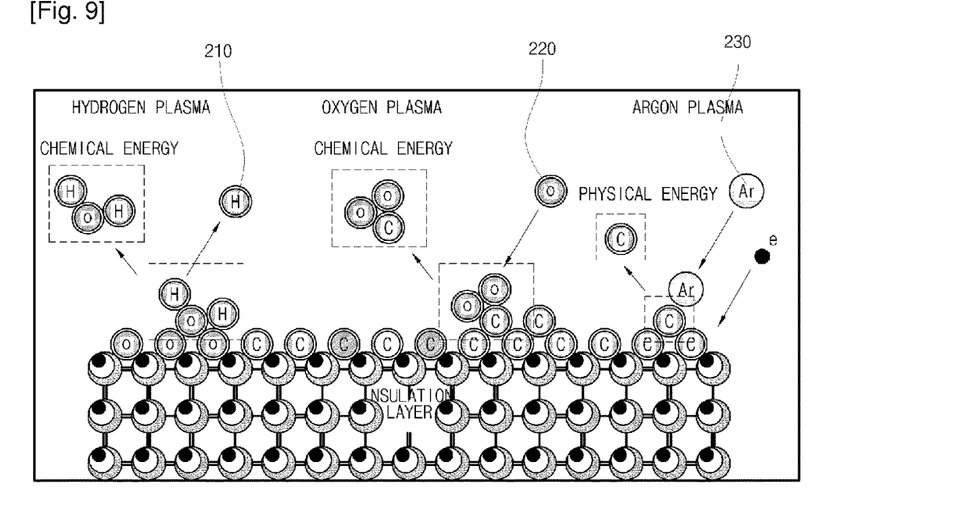
FIG. 9 is a view showing a process for performing plasma treatment on the insulation film 100 according to still another exemplary embodiment of the present invention.

FIG. 9 is a view showing a process for performing plasma treatment on the insulation film 100 according to still another exemplary embodiment of the present invention.

Referring to FIG. 9, the plasma treatment is carried out by ionizing plasma gas to form plasma formed of electrons, neutrons, and protons and exposing the ionized plasma to the insulation film 110. The plasma includes hydrogen, oxygen and argon plasmas. In the present invention, the plasma treatment of the insulation film 110 is performed using Ar gas among a plurality of plasma gases.

Referring to FIG. 9, in a case where the surface coated with the molding resin of the insulation film 110 is exposed to a hydrogen plasma 410 or an oxygen plasma 420, the oxygen plasma or hydrogen plasma is connected to hydrogen or carbon which exists in the surface coated with the surface coated with the molding resin of the insulation film 110, so the oxygen plasma or hydrogen plasma is separated as $HO_2$ or $CO_2$. Thus, roughness of the surface coated with the molding resin of the insulation film 110 may be increased.

However, when the argon plasma 430 is exposed to the surface coated with the molding resin of the insulation film 110, the argon plasma 430 is connected to carbon which exists in the surface coated with the molding resin of the insulation film 110, and is exactly attached to the surface coated with the molding resin of the insulation film 110. Thus, the roughness of the surface coated with the molding resin of the insulation film 110 may be increased.

Thus, when the molding resin is coated with the surface having the improved roughness, the molding resin is not well peeled off from the insulation film 110. Strength that the molding resin is not peeled off from the insulation film 110 is called "peel strength". Table 1 below shows peel strength based on plasma treatment power.

Table 1

TABLE 1

| Plasma Power | Peel Strength (kgf/cm) |
|---|---|
| No plasma | 0.02 |
| 2500 W | 1.47 |
| 3000 W | 1.43 |
| 3500 W | 1.51 |
| 4000 W | 1.57 |

As shown in Table 1 above, as plasma power increases, peel strength substantially increases. That is, as the plasma power increases, roughness of the insulation film 110 increases.

Then, as illustrated in FIG. 7(*d*), the via holes are formed in the base material 100. At this time, the method of forming the via holes 190 may use the punching processing process or the laser drill process and the like.

After forming the via holes, as illustrated in FIG. 7(*e*), the metal layer 210 is formed in the upper part of the base material 100, more specifically, in the upper part of the adhesive layer 150.

Then, the substrate for the chip packages is manufactured by forming the circuit pattern layer 230 as illustrated in FIG. 8(*f*).

After the substrate for the chip packages is manufactured by the aforesaid processes, a chip 310 is mounted on a lower part of the lower adhesive layer 130, the chip 310 and the circuit pattern layer 130 are bonded and are electrically connected to each other using a wire 330, and a molding resin is applied to a lower part of the chip 310 to thereby form a molding part 350 which embeds the chip and the wire, so that a chip package may be manufactured.

As previously described, in the detailed description of the invention, having described the detailed exemplary embodiments of the invention, it should be apparent that modifications and variations can be made by persons skilled without deviating from the spirit or scope of the invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims and their equivalents.

The invention claimed is:

1. A method of manufacturing a substrate for chip packages, comprising:
    forming an adhesive layer only on an upper surface of an insulation film to produce a base material, wherein the insulation film is formed of polyimide, polyethylene naphthalate, or polyethylene terephthalate, and wherein the adhesive layer is composed of an adhesive or a bonding sheet;
    forming surface roughness only on a lower surface of the insulation film, after forming the adhesive layer on the upper surface of the insulation film, by performing plasma treatment on the lower surface of the insulation film such that the lower surface of the polyimide, the polyethylene naphthalate, or the polyethylene terephthalate has the surface roughness, wherein the plasma treatment is performed using an argon plasma;
    forming via holes, after forming the surface roughness, through the base material;
    forming a circuit pattern layer, after forming the via holes, on the adhesive layer;
    mounting a chip, after forming the circuit pattern layer, under the surface roughness of the lower surface of the insulation film of the substrate for chip packages;
    bonding the chip and the circuit pattern layer, after mounting the chip, by using a wire to electrically connect said chip and said circuit pattern layer; and
    forming a molding part, after bonding the chip and the circuit pattern layer, that is coated with a molding resin and embeds the chip and the wire in a lower part of the chip,
    wherein the wire connects the chip and the circuit pattern layer through the via holes.

2. The method of claim 1,
    wherein the molding part is disposed in the via holes.

3. The method of claim 1, wherein the forming of the via holes is performed by a punching process or a laser drill process.

4. The method of claim 1, wherein the forming of the circuit pattern layer includes forming a metal layer on the adhesive layer, and etching the metal layer to form a circuit pattern.

5. The method of claim 4, wherein the metal layer is made of Cu.

6. The method of claim 1, further comprising forming a plated layer selectively on one surface of the circuit pattern layer or both surfaces after the step of forming the circuit pattern layer.

7. The method of claim 6, wherein the plated layer comprises at least one of Ni, and Au.

8. The method of claim 1, wherein the chip is not vertically overlapped with the via holes.

9. The method of claim 1, wherein the surface roughness comprises: a first surface roughness in direct physical contact with the chip; a second surface roughness in direct physical contact with the molding part; and a third surface roughness physically separated from both the chip and the molding part.

10. The method of claim 9, wherein the third surface roughness is not vertically overlapped with the circuit pattern layer.

11. The method of claim 9, wherein a portion of the first surface roughness is not vertically overlapped with the circuit pattern layer.

* * * * *